United States Patent [19]
Van Houdt et al.

[11] Patent Number: 6,009,013
[45] Date of Patent: *Dec. 28, 1999

[54] CONTACTLESS ARRAY CONFIGURATION FOR SEMICONDUCTOR MEMORIES

[75] Inventors: Jan F. Van Houdt, Bekkevoort; Guido Groeseneken, Leuven; Herman Maes, Bierbeek, all of Belgium

[73] Assignee: Interuniversitair Micro-Elektronica Centrum vzw, Leuven, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/426,685

[22] Filed: Apr. 21, 1995

Related U.S. Application Data

[63] Continuation-in-part of application No. 08/275,016, Jul. 13, 1994, Pat. No. 5,583,811, and application No. 08/080,225, Jul. 21, 1993, Pat. No. 5,583,810, which is a continuation-in-part of application No. 07/827,715, Jan. 29, 1992, abandoned, said application No. 08/275,016, is a continuation of application No. 08/080,225.

[51] Int. Cl.$^6$ ................................................. G11C 11/34
[52] U.S. Cl. ................................ 365/185.14; 365/185.15; 365/185.16
[58] Field of Search ....................... 365/185.14, 185.15, 365/185.16

[56] References Cited

U.S. PATENT DOCUMENTS

| | | | |
|---|---|---|---|
| 4,503,519 | 3/1985 | Arakawa | 365/104 |
| 4,608,591 | 8/1986 | Ipri et al. | 357/54 |
| 4,794,565 | 12/1988 | Wu et al. | 365/185 |
| 4,821,236 | 4/1989 | Hayashi et al. | 365/185 |
| 5,042,009 | 8/1991 | Kazerounian et al. | 365/185 |
| 5,077,691 | 12/1991 | Haddad et al. | |
| 5,212,541 | 5/1993 | Bergemont | 257/319 |
| 5,280,446 | 1/1994 | Ma et al. | 365/185 |
| 5,284,784 | 2/1994 | Manley | 437/43 |

FOREIGN PATENT DOCUMENTS

| | | |
|---|---|---|
| 0 228 761 | 9/1986 | European Pat. Off. . |
| 501 941 | 9/1992 | European Pat. Off. . |
| 509 698 | 10/1992 | European Pat. Off. . |
| 59-58868 | 4/1984 | Japan . |
| 60-9168 | 1/1985 | Japan . |

OTHER PUBLICATIONS

IEDM, 1988, R. Kazerounian et al., "A 5 Volt High Density Poly—Poly Erase Flash EPROM Cell," IEEE (p.436).
IEDM, 1987, H. Kume et al., "A Flash–Erase EEPROM Cell with an Asymmetric Source and Drain Structure," IEEE (p. 560).

(List continued on next page.)

*Primary Examiner*—A. Zarabian
*Attorney, Agent, or Firm*—McDonnell Boehnen Hulbert & Berghoff

[57] ABSTRACT

The present invention relates to the field of electrically erasable and programmable nonvolatile semiconductor memories (EEPROM) and, in particular, to contactless array configurations that are used for the practical and efficient implementation of a particular type of memory transistor. Such a memory transistor allows fast 5V-only programming by the use of an enhanced source-side injection mechanism. This concept requires a program gate in the field oxide region which serves to capacitively couple a high voltage to the floating gates. Thus, a very high injection current is established during programming. This additional program gate, however, increases the cell area considerably. The present disclosure shows a contactless 5V-only Flash EEPROM array configuration that relies on shared program lines in order to minimize the area overhead that is caused by this program gate. Furthermore, a memory array with shared wordlines is presented which further enhances the density achievable.

14 Claims, 16 Drawing Sheets

OTHER PUBLICATIONS

IEDM, 1986, A.T. Wu et al., "A Novel High–Speed 5–Volt Programming EPROM Structure with Source–Side Injection," IEEE (p. 584).

IEDM, 1980, Masashi Wada et al., "Limiting Factors for Programming EPROM of Reduced Dimensions," IEEE (p. 38).

Dec., 1987, IEEE Transactions on Electron Devices, vol. ED–34, No. 12, Prall et al., "Characterization and Suppression of Drain Coupling in Submicrometer EPROM Cells" (p. 2463).

European Search Report for corresponding application BE 9100091 bearing the date "Oct. 08, 1991."

1993, Nonvolatile Memory Technology Review, J. Van Houdt, et al., "A 5v/3.3V–Compatible Flash E$^2$PROM Cell with a 400ns/70μs Programming Time for Embedded Memory Applications," IEEE (p. 54).

Dec. 1993, IEEE Transactions on Electron Devices, vol. 40., No. 12, Jan Van Houdt et al., HIMOS—A High Efficiency Flash E$^2$PROM Cell for Embedded Memory Applications (p. 2255).

Sep. 1994, IEEE Transactions on Components, Packaging, and Manufacturing Technology—Part A, vol. 17, No. 3, Jan Van Houdt et al., "A 5 V–Compatible Flash EEPROM Cell with Microsecond Programming Time for Embedded Memory Applications" (p. 380).

Sep. 13–16, 1993, 23rd European Solid State Device Research Conference, Failure Physics and Analysis, Jan Van Houdt et al., "Optimization of a Submicron HIMOS Flash E$^2$PROM Cell for Implementation in a Virtual Ground Array Configuration," pp. 381–384.

Oct. 4–7, 1994, 5th European Symposium on Reliability of Electron Devices, Failure Physics and Analysis, D. Wellekens et al., "Write/Erase Degradation and Disturb Effects in Source–Side Injection Flash EEPROM Devices".

Esquivel, J. et al., "High Density Contactless, Self Aligned EPROM Cell Array Technology," IEEE, 1986, p. 592.

GIll, M. et al., "A 5–Volt Contactless Array 256KBit Flash EEPROM Technology," IEEE, 1988, p. 428.

CONTACTLESS ARRAY CONFIGURATION FOR SEMICONDUCTOR MEMORIES

RELATED APPLICATIONS

This is a continuation-in-part application of the following two United States applications, which are currently pending before the U.S. Patent Office: (1) application Ser. No. 08/275,016, filed Jul. 13, 1994, now U.S. Pat. No. 5,583,811, issued Dec. 10, 1996 and initially entitled "Transistor Structure for Erasable and Programmable Semiconductor Memory Devices and Method for Programming Same" and changed in a Preliminary Amendment to read "Transistor Structure for Erasable and Programmable Semiconductor Memory Devices" and (2) application Ser. No. 08/080,225, filed Jun. 21, 1993, Now U.S. Pat. No. 5,583,810, issued Dec. 10, 1996 and initially entitled "Transistor Structure for Erasable and Programmable Semiconductor Memory Devices and Method for Programming Same" and changed in an Amendment to read "Method for Programming a Semiconductor Memory Device."

Application Ser. No. 08/275,016 is a continuation application of application Ser. No. 08/080,225 filed on Jun. 21, 1993. Application Ser. No. 08/080,225 is a continuation-in-part of U.S. patent application Ser. No. 07/827,715, filed on Jan. 29, 1992 and now abandoned. Application Ser. No. 07/827,715 claims priority based on Belgian Application Serial No. 09100091 filed Jan. 31, 1991.

Applicants of the present application have been named as the inventors in each of the applications identified above. Applicants claim the benefit of U.S. application Ser. Nos. 08/275,016 and 08/080,225 as to the common subject matter.

BACKGROUND OF THE INVENTION

1. Field of the Invention

The invention relates to the field of electrically erasable, programmable read-only-memory ("EEPROM") devices and, particularly, to an efficient contactless array configuration for the implementation of memory cells that rely on source-side injection for fast programming. Even more particularly, the invention relates to a contactless array configuration with shared program gates for erasable and programmable semiconductor memories based on enhanced hot-electron injection cells.

2. Field of the Prior Art

Recently, Flash EEPROM memories have gained substantial interest as the best solution for electrically-rewritable high-density nonvolatile data storage. These semiconductor memories combine the high integration density and high programming speed of EPROMs with the higher functionality of EEPROMs by offering electrical in-circuit erasability. Typically, Flash memories are distinguished from "classical" EEPROMs by their block (or sector) erase scheme. That is, in a Flash memory the byte-selective erasability of EEPROMs is sacrificed for the sake of a higher integration density. The possibility exist, however, to divide the memory in different sectors which can be erased separately.

At first, Flash memory was introduced for replacing EPROMs and battery-backed Random Access Memories ("RAMs") in measuring equipment (calibration, trimming, data storage), tuners and TV sets (programmable channel selection), and in microcomputers (microcode updates). On the other hand, new applications have arisen, such as solid-state disks for small computers and Personal Digital Assistants ("PDAs"), program storage for Digital Signal Processing ("DSP") chips and for portable equipment, smart cards, automotive applications (such as fuel injection control and Automatic Braking Systems ("ABS systems")) and neural networks. Additionally, a trend has arisen to integrate logic and nonvolatile memory on the same chip: the so-called embedded memories which require a compromise between performance, density and processing complexity.

Generally, as described below, three main classes of Flash memories can be identified.

The first class uses conventional channel hot-electron injection at the drain junction as a fast but power-consuming programming mechanism. Erasure is achieved by Fowler-Nordheim injection from the floating gate towards the source junction. See FIG. 1. The main advantage of this cell is the small area, which makes it well-suited for high density applications (so-called bulk memory). The main disadvantages are the high processing complexity and the high power consumption (in order to compensate for the intrinsically low programming efficiency), and the presence of major reliability problems (overerase, soft-write and short-channel effects, drain disturb), which compromise the scalability of this memory concept. On the other hand, the conventional NOR array configuration (see FIG. 2)—which is commonly used for this type of memory—requires ½ contact per bit. This is a yield limiting factor at the considered ever-increasing densities (currently 16 Megabit). A contactless version of such an array has also been proposed, however, at the expense of a complicated bitline segmentation scheme and a lower programming and read-out speed.

The second class uses bi-directional Fowler-Nordheim tunneling and is essentially derived from conventional FLO-TOX EEPROMs (see FIG. 3). The main advantage is the very low power consumption which is required for Fowler-Nordheim programming. Therefore, the programming voltages can be generated on-chip, and operation from a single supply voltage is obtained. The main disadvantages are the very high voltages (20V) to be switched on-chip and the corresponding reliability issues (oxide defects, junction breakdown), the large transistor area, and the low programming speed. A smaller area can, however, be achieved by increasing the processing complexity and by reducing the gate coupling coefficient at the expense of even higher programming voltages. A typical high-density configuration for these memories is the NAND configuration (see FIG. 4), which suffers from a very high access time in the order of microseconds.

Faster programming can be achieved by using page-mode programming techniques, which, however, complicate circuit design. Finally, the scalability of this concept is highly questionable, especially because of the limitations with respect to tunnel oxide scaling.

The third class of Flash memory transistors emerged only a few years ago and was meant to combine the advantages of the previous two classes. Although entirely different transistor structures have been proposed, they all aimed at increased programming efficiency. The High Injection Metal-Oxide-Semiconductor (or HIMOS) transistor, which is described in co-pending applications having Ser. Nos. 08/275,016 and 08/080,225, belongs to this last category and, more specifically, it combines a low development entry cost with the remarkable features of the enhanced injection mechanism, yielding a low-cost, single-supply voltage, fast-programmable Flash memory technology, which requires only moderate voltages on-chip, and which shows a high immunity with respect to soft-write, overerase, short-channel and drain disturb effects. See FIG. 5. The triple-gate structure and the specific operation modes of this cell allow the implementation into a dense contactless array which partially compensates for the somewhat larger transistor area. This renders the HIMOS transistor into an attractive candidate for medium-density, cost-effective Flash EEPROM applications.

Once a transistor concept has been defined in a given process technology, it has to be designed in such a way that a practical memory organization is obtained. Moreover, the transistor properties have to be exploited in order to optimize the density of the resulting memory array, taking into account the main circuit-related parameters, such as disturb conditions, read-out current, and capacitive and resistive loads for the periphery circuits. Therefore, the basic layout of the transistor depends strongly on how different transistors are to be interconnected in a circuit. This is where the term "memory cell" comes in: the memory cell, as opposed to transistor, is the practical layout of the transistor which is repeatedly copied through mirroring or translation along its symmetry axes in order to produce the full memory array.

The advantages of optimizing memory cells for contactless arrays in EPROM and EEPROM memories have long been recognized. Esquivel et al., "High Density Contactless, Self Aligned EPROM Cell Array Technology", IEDM 1986, describe the principle in a conventional EPROM array, while Gill et al., "A 5 Volt Contactless Array 256K Bit Flash EEPROM Technology", IEDM 1988, describe a similar contactless array for Flash memories.

It is also well known that asymmetrical Flash memory transistors, which often use source-side injection as a programming mechanism, are well-suited for the implementation in contactless arrays. U.S. Pat. No. 5,212,541, issued May 18, 1993 to Bergemont, discloses such a contactless array for cells programmed through source-side injection. However, the coupling line which is mentioned in Bergemont's patent is provided for every separate row in the array, which causes a considerable overhead with respect to the density of the array. Furthermore, when referring to FIG. 6 in the Bergemont patent, it is noted that all cells are oriented in the same direction, which implies a virtual ground array configuration. Therefore, the Bergemont configuration is incorrect, since the source line cannot be shared between adjacent cells in a row without alternating the position of the source and drain junctions of the memory cells along each row.

U.S. Pat. No. 5,280,446, issued Jan. 18, 1994 to Ma et al., and U.S. Pat. No. 5,284,784, issued Feb. 8, 1994 to Manley, both disclose other examples of a contactless array for source-side injection cells. These configurations, however, also provide a separate control line for every column or row, respectively. The area overhead caused by these configurations can be largely relaxed by the use of an additional polysilicon layer, however, at the expense of using a complicated triple polysilicon technology.

The present invention substantially circumvents these drawbacks by introducing a shared program line scheme, which substantially reduces the area overhead caused by the program gates of the memory cells without adding additional processing steps. The concept of using a contactless array for the HIMOS cell described in co-pending applications Ser. Nos. 08/275,016 and 08/080,225 is mentioned in these applications at page 15, lines 26–35. In the present application, however, this concept is further refined and optimized to produce a practical array organization.

SUMMARY OF THE INVENTION

As already described in the co-pending applications Ser. Nos. 08/275,016 and 08/080,225, the HIMOS memory transistor has three separate gates formed in two polysilicon layers (FIG. 5):

The control gate, which is formed in the second polysilicon layer and which controls the first part of the channel extending from the source junction to the point where the enhanced hot-electron injection occurs. This point is further referred to as the "split point".

The floating gate, which is formed in the first polysilicon layer and which controls the second part of the channel extending from the split point to the drain junction, and which serves to collect electrons during the programming operation.

The program gate, which is formed in the second polysilicon layer and which is capacitively coupled to the floating gate extension which is present outside of the active transistor region (see FIG. 5). The coupling coefficient between the program gate and the floating gate can be enhanced by using a separate interpoly dielectric with a small equivalent oxide thickness, such as a stacked oxide-nitride-oxide (ONO) layer.

Where the foregoing applications dealt especially with the HIMOS transistor structure and operation, the present application is specifically referring to the optimum array configuration for implementing HIMOS transistors in memory circuits. Because of the triple-gate structure of the HIMOS transistor, the conventional NOR configuration (see FIG. 2) can no longer be used in an efficient way.

However, by using a contactless buried-bitline scheme in which the program gates are shared between adjacent rows, the cell area can be significantly reduced down to the level where cost-effectiveness is obtained for medium-density and embedded applications. If the bitlines are also shared between adjacent columns, a virtual ground array is obtained with even higher density at the expense of a somewhat more complicated column decoding. Also, the wordlines can be shared between adjacent rows, which leads to an even higher density at the expense of a more complicated row decoder. These and other objects, features, and advantages of the present invention are discussed or apparent in the following detailed description.

BRIEF DESCRIPTION OF THE DRAWING

A preferred embodiment of the present invention is described herein with reference to the drawing wherein:

FIGS. 5, 5A-A', and 5B-B' show a basic contactless layout of the HIMOS cell with two perpendicular cross-sections and typical programming (writing) conditions. A control gate 50, program gate 51, floating gate 52, source 53, drain 54, and split point 55 are shown. Programming is established by enhanced (or source-side) injection of hot electrons at the split point. The represented drawings are identical to the drawings given in FIGS. 1, 2 and 3 from the C-I-P application having Ser. No. 08/080,225.

FIG. 6 Optimized HIMOS cell layout as used in a contactless Virtual Ground Array (VGA) with shared program gates. The floating gates are formed in the first polysilicon layer, while the control gate and the program gate are formed in the second polysilicon layer. Each program gate serves as a coupling capacitor for two different cells. Duplicating the presented layout in the horizontal direction constitutes a program line which connects all program gates of two adjacent rows of cells.

FIG. 7 Optimized HIMOS cell layout as used in a contactless VGA with shared program gates and shared control gates. In this case, also the control gates of adjacent cells are shared. Duplicating the presented layout in the horizontal direction constitutes a wordline which connects all control gates of two adjacent rows of cells.

FIG. 8 Optimized HIMOS cell layout as used in a contactless common source array. In this case, each column of cells has a separate bitline.

DETAILED DESCRIPTION OF THE PREFERRED EMBODIMENTS

Several illustrative array embodiments are described below, which use similar cell layouts and the same basic cell operating modes. Depending on the particular array configuration, different features are however obtained from the point of view of array operation. Therefore, in a first section of this description, the basic cell layouts are discussed. In a second section, the different array configurations and their typical features are discussed.

1. Basic Cell Layouts and Operating Modes

Figure 6:
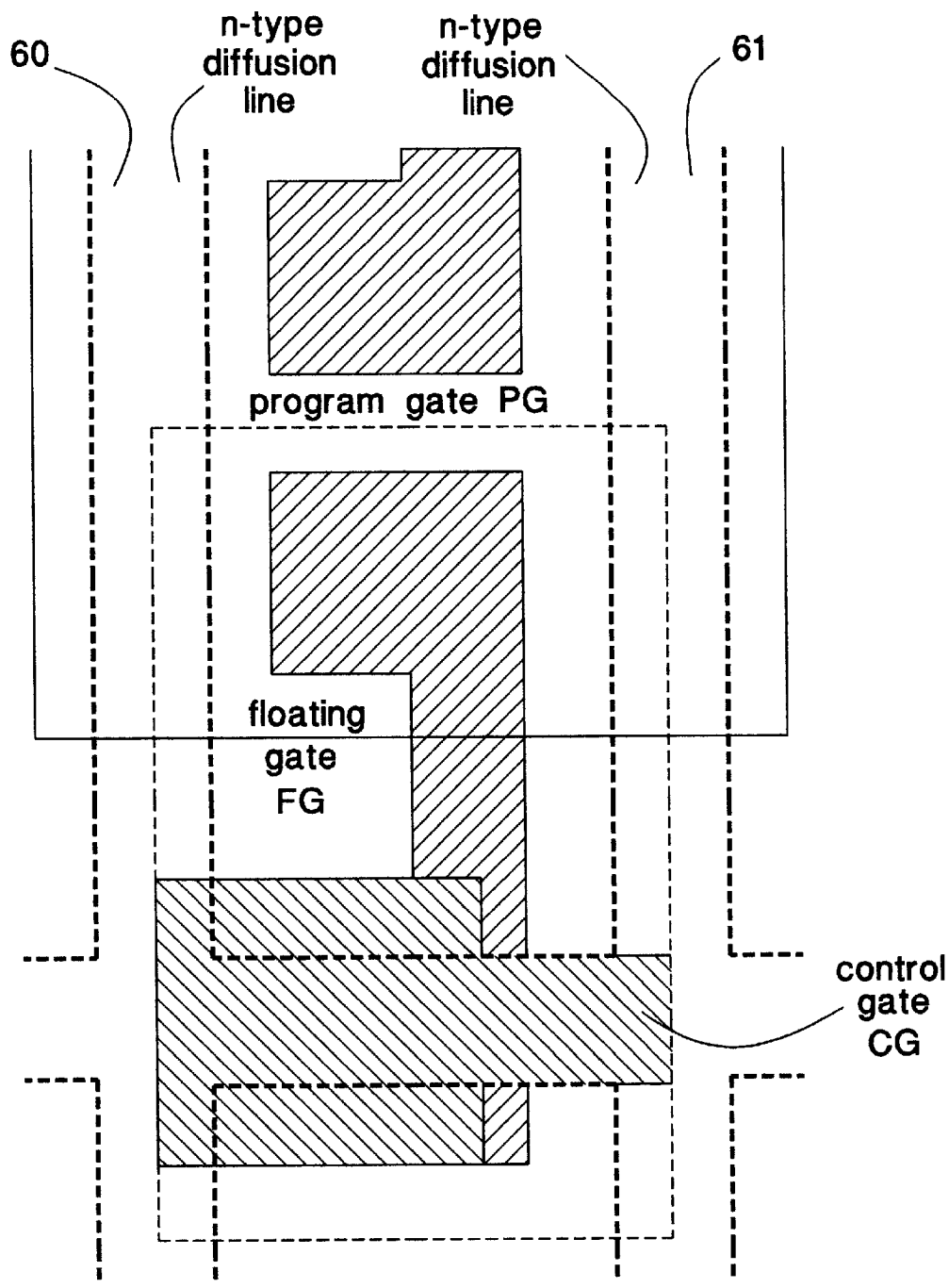
FIGS. 6–8 show an optimized HIMOS cell layout as used in a contactless array with shared program gates.

FIG. 6 shows the cell layout of the HIMOS cell as used in a contactless array with shared program gates. The control gate forms the wordline of the array and is running horizontally over the active transistor area and over the source and drain junctions of the cells sharing the same row. The shape of the wordline has been designed in order to minimize the parasitic coupling coefficient between the control gate and the floating gate. On the other hand, the program gates of two adjacent wordlines are merged into one program line, which is also running horizontally across the array.

Since the source and drain junctions of the different cells are connected to vertical diffusion lines which run under the polysilicon wordlines and program lines, these diffusion lines are connected to a metal strap (for example, every 16 or 32 bits). This explains the term "contactless array". Depending on the particular array configuration, the symmetry axes of the array can be positioned at any of the dashed lines represented in FIGS. 6 to 8 (see Section 2 below).

As already explained in the co-pending applications, the cell is programmed to a high threshold voltage by applying a low voltage (1–1.5V) to the control gate and a high voltage to the program gate (10–12V), while the supply voltage (3.3V or 5V) is applied to the drain junction. The source junction and the silicon substrate (or p-well) are both grounded.

Erasure can be accomplished in different ways:

Fowler-Nordheim tunneling of electrons from the floating gate towards the drain junction is activated by applying a high negative voltage (−10 to −12V) to the program gate, while the supply voltage is applied to the drain. In this erase mode, the control gate has to be kept grounded in order to maximize the tunneling field at the drain-to-floating-gate overlap. The potential applied to the source junction is of no importance during erasure.

Figure 9:
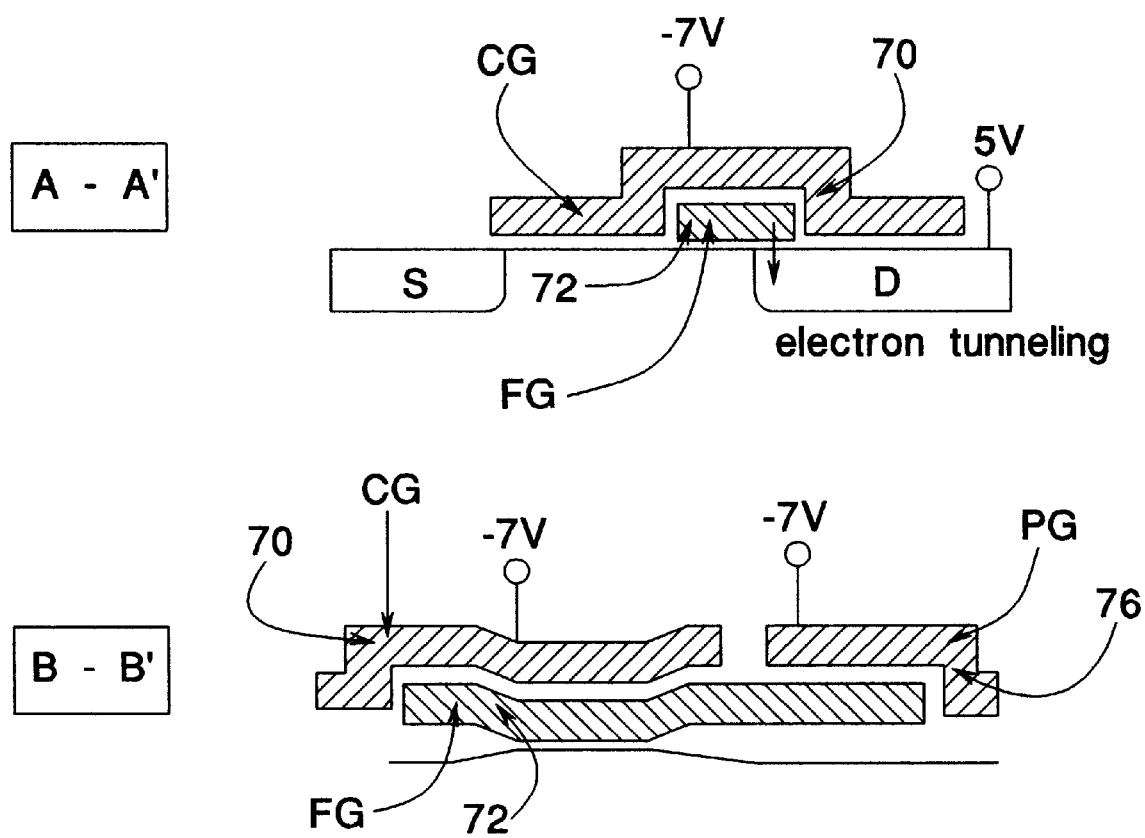
FIGS. 9 A-A' and 9B-B' show an alternative erase mode with moderate negative voltages applied simultaneously to the control gate 70 and the program gate 71. A floating gate 72 is also shown.

If the wordline and the program line of the considered sector are connected during the erase operation, a lower gate voltage can suffice (typically −7 to −8V). The parasitic control-gate-to-floating-gate capacitance is then used to further enhance the electric field across the tunnel oxide. In this case, the erase mechanism stays essentially the same as in the previous case, but the necessary negative voltage is lowered at the expense of additional switching circuitry. This erase mode is illustrated in FIG. 9.

Another possible erase scheme is offered by the channel erase mechanism. In this case a negative voltage is applied to the program line, eventually combined with the supply voltage applied to the substrate (or p-well) of the memory array. In this case a uniform erase current is obtained in the tunnel oxide region which is beneficial from the point of view of oxide stress and programming window closure after write/erase cycling. The main advantage of this scheme is the absence of any band-to-band tunneling current from the drain junction to the p-type substrate or well. The main disadvantage is the higher negative voltage which is required if only a program-gate voltage is applied, and the higher processing complexity (triple well CMOS) if the supply voltage is simultaneously applied to the substrate or well.

A last possible erase mechanism is the polyoxide conduction from floating gate to control gate which can be established by applying a high positive voltage to the control gate. This is possible without any changes to the cell design because the coupling coefficient between the control gate and the floating gate has already been minimized, as mentioned before. This erase scheme has also been described in the co-pending application Ser. No. 08/080,225. The main advantages are the redundancy of a negative charge pump and the corresponding negative voltage switching circuitry, the lower power consumption, less critical disturb effects, and the redundancy of a tunnel oxidation step. The main disadvantages are the additional processing complexity related to the formation of a textured polyoxide layer, and the lower number of write/erase cycles.

In general, the above-mentioned erase mechanisms do not influence the cell layout, except for the polyoxide alternative, which does not need a tunnel oxide mask.

The read-out operation requires a small voltage at the drain junction (typically 2V) and a small voltage at the control gate (typically 3V) while the program gate is kept grounded. Depending on the particular array organization, it may, however, be necessary to apply a positive or negative voltage to the program gate during the read-out operation, as explained in Section 2. The considered operating modes are summarized in Table 1.

2. Different Array Embodiments 2.1 Cell Symbol

Figure 10:
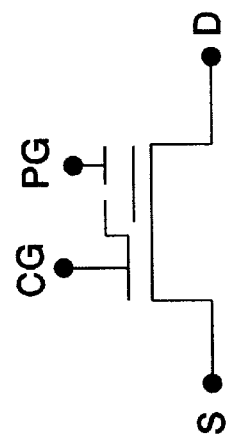
FIG. 10 shows an HIMOS symbol for array description. Four device terminals are presented: the source (S) and drain (D) junctions, the control gate (CG) and the program gate (PG).

In order to obtain readable drawings, the HIMOS cell layout that is copied in order to produce the entire array is replaced by a small convenient symbol which is represented in FIG. 10. This symbol is used in the remainder of this section in order to allow a clear representation of the different array configurations. It should, however, be kept in mind that every HIMOS symbol in the following figures has to be replaced by a cell layout such as those represented in FIGS. 6 to 8 in order to build the entire memory array.

2.2 Virtual Ground Array

Figure 5:
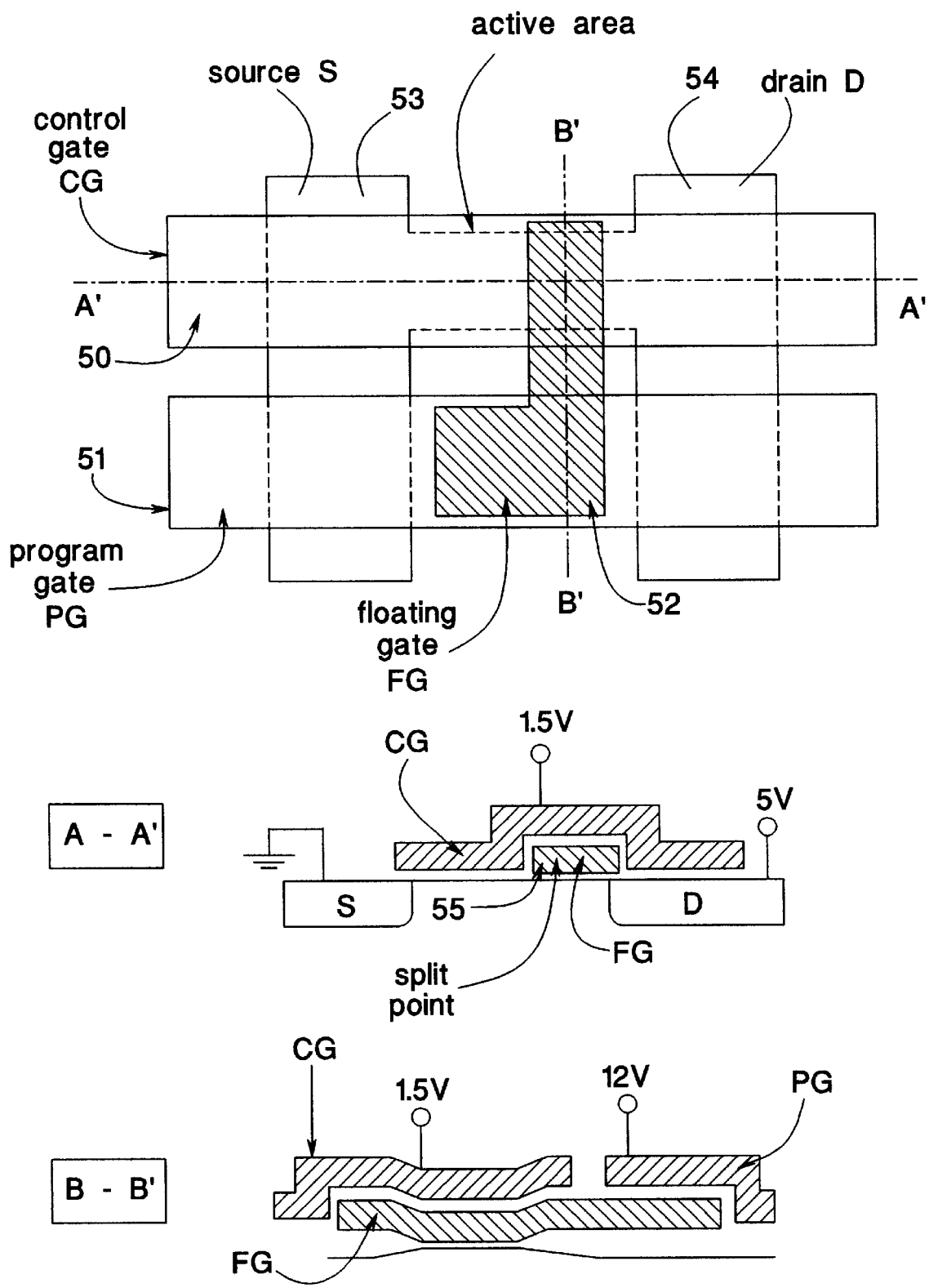
Figure 11:
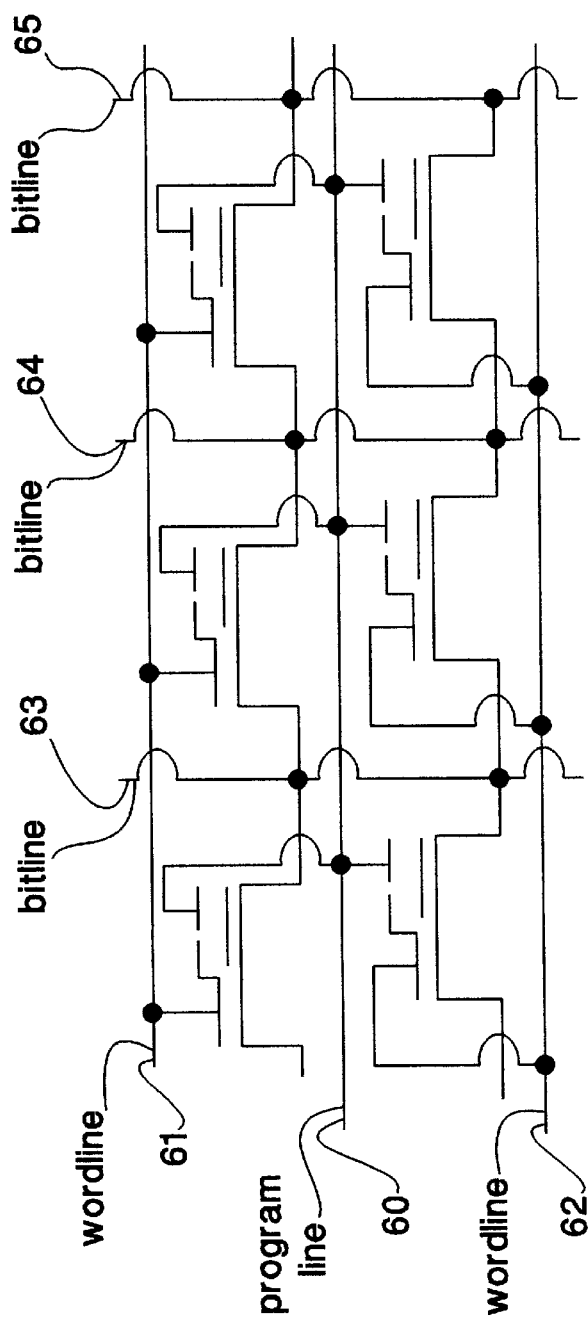
FIG. 11 shows a basic virtual ground array with a shared program line 60. Wordlines 61, 62 and bitlines 63, 64, and 65 are also shown. Duplicating the cell layout of FIG. 6 according to the connections given in FIG. 11 establishes the layout of the basic virtual ground array.

A typical example of a contactless array is the virtual ground array, as already mentioned in the foregoing application Ser. No. 07/080,225 at page 7, lines 1–3, and page 8, lines 27–31, and page 15, lines 3–8. The practical application of the virtual ground concept to HIMOS cells is shown in FIG. 11. Due to the sharing of the program line between two adjacent rows, the cells are mirrored along the two horizontal symmetry axes in order to produce the array. Along every row the cells are oriented in the same direction (source on the left, drain on the right hand side), and, therefore, every diffusion line in FIG. 5 is connected to the source junction of the cell on the right hand side, as well as to the drain junction of the cell on the lefthandside of the considered diffusion line. This configuration has several consequences:

Since every diffusion line serves the function of a source line (connected to the source junctions of cells) as well as that of a bitline (connected to the drain junctions of cells), source lines and bitlines are indistinguishable and none of these lines can be physically connected to the substrate (or ground) potential. This "virtual ground property" implies that all diffusion lines have to be connected to the column decoder which has a small but negative impact on read-out speed in a memory circuit;

Due to the sharing of the diffusion lines between neighboring cells a very compact array is obtained which allows relatively high density integration. The cell area for a 0.7 um technology is in the order of 13 to 15 um$^2$ depending on the available interpolysilicon technology;

Unintentional reverse programming of the cell which is next to the cell being programmed has to be suppressed sufficiently. This offers no problem in HIMOS arrays because of the highly asymmetrical transistor structure;

Column decoding is not straightforward since neighboring cells in the same row can not be read-out at the same time, due to the shared diffusion lines. This problem is solved in the peripheral electronics which control the access to the array;

The smallest erase sector that can be defined in the case of Fowler-Nordheim tunneling is a pair of adjacent rows sharing the same program line. All diffusion lines in the considered sector are connected to the supply voltage during erasure;

In the case of polyoxide erase, the smallest sector is defined as a wordline, since the erase voltage is then applied to the control gate.

Figure 12:
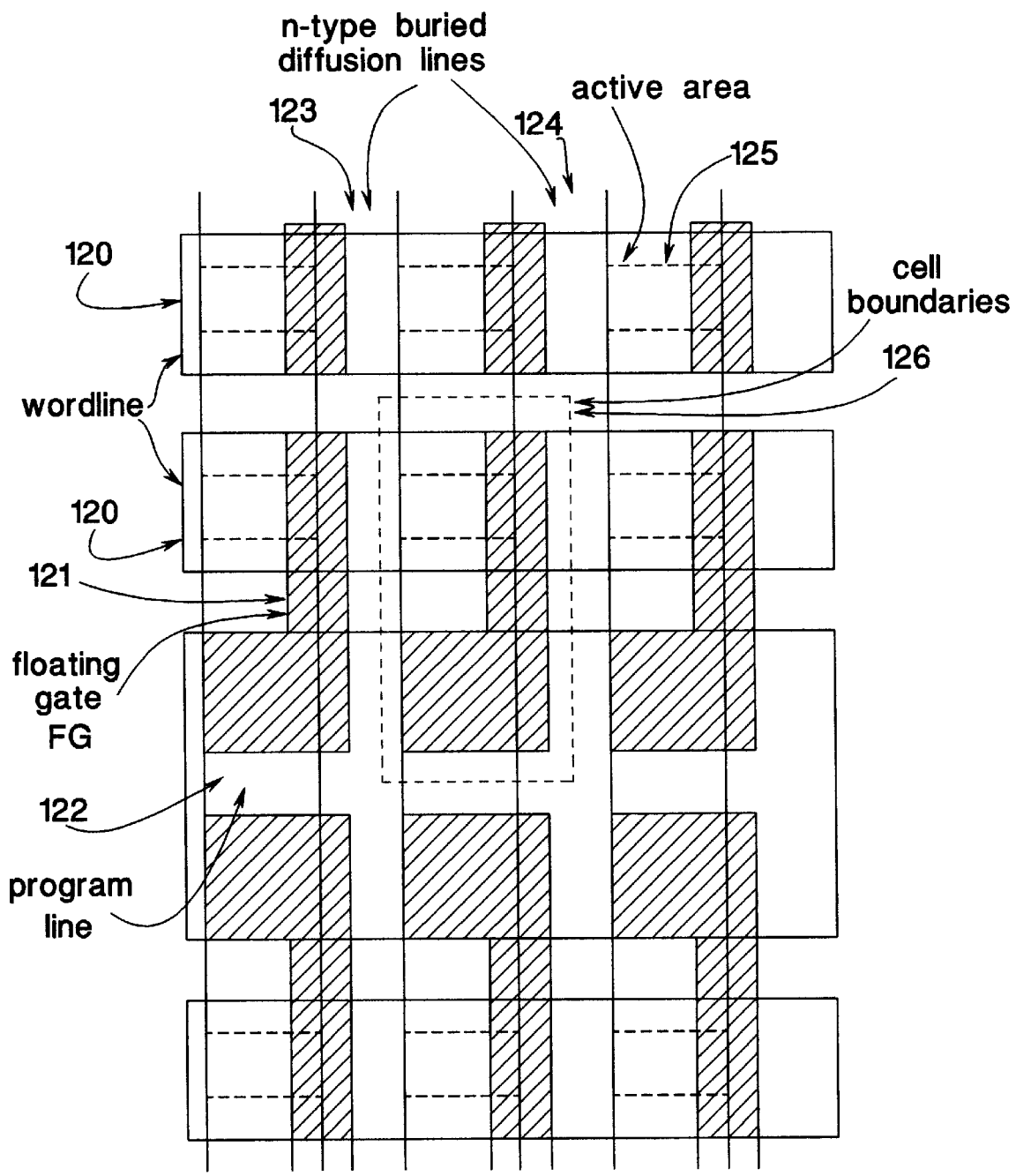
FIG. 12 shows a virtual ground array with shared program gates. Wordlines 120, floating gate 121, program line 122, n-type buried diffusion lines 123, 124, an active area 125, and cell boundaries 126 are also shown. The diffusion lines are buried under the field oxide in order to save cell area (the field oxide area is complementary to the active area shown in the figure). The corresponding cell cross-section has already been presented in FIG. 9 of the C-I-P application Ser. No. 08/080,225.
Figure 13:
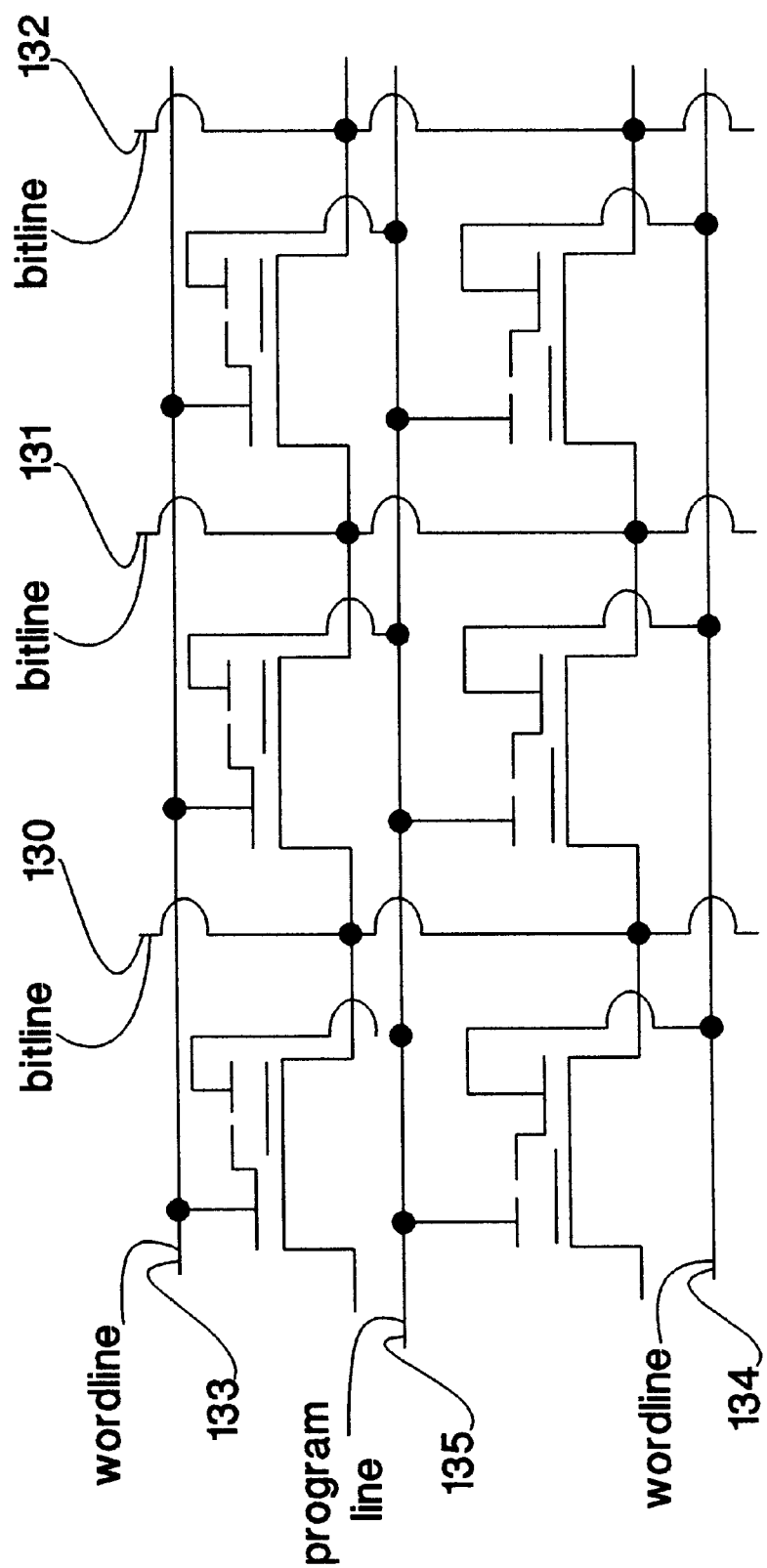
FIG. 13 shows a virtual ground array with alternating source/drain configuration. Bitlines 130, 131, and 132, wordlines 133, 134, and a program line 135 are shown.
Figure 14:
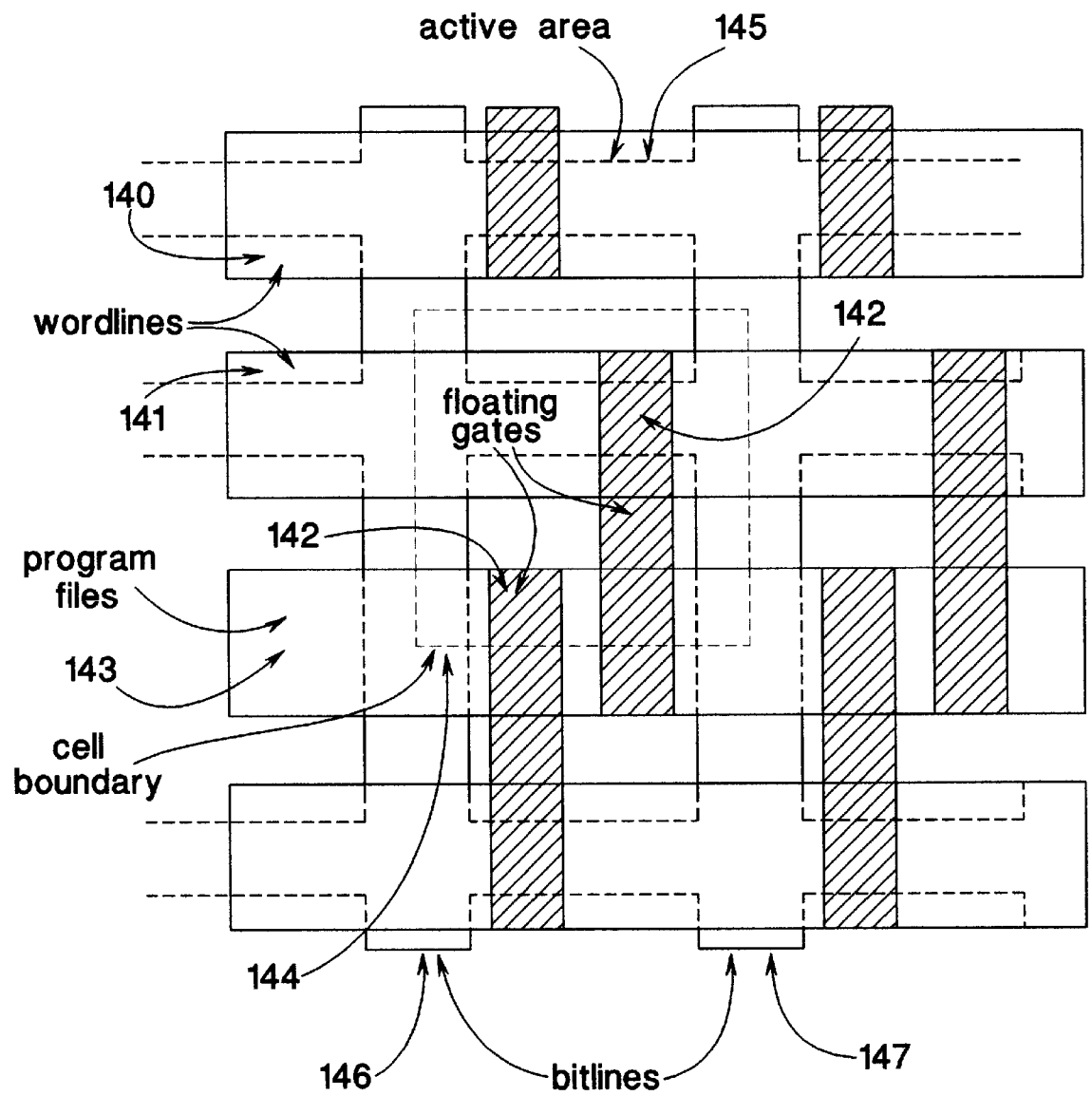
FIG. 14 shows an array layout in the case of alternating source/drain configuration. Wordlines 140, 141, floating gates 142, a program line 143, cell boundary 144, active area 145, and bitlines 146 and 147 are shown.

If the source and drain junctions are formed before the growth of the field oxide, the spacing between adjacent floating gates in a row can be reduced to the minimum polysilicon spacing rule, which realizes a very compact array. This embodiment of the cell is also described in the foregoing applications Ser. Nos. 08/080,225 and 08/275, 016. FIG. 12 shows the resulting layout when implementing this cell in a contactless array. This cell has an area of 10 um$^2$ in a 0.7 um technology;

A second embodiment of a virtual ground HIMOS array is shown in FIG. 13. In this case, all cells on a particular row are oriented in the same direction but the horizontal orientation of the cells is alternating between adjacent rows. Since the source and drain junctions of the cells switch places between rows, the L-shape of the floating gate as shown in FIG. 5 can be replaced by rectangular floating gates in order to save area (FIG. 14). This is especially interesting in high density applications.

Figure 7:
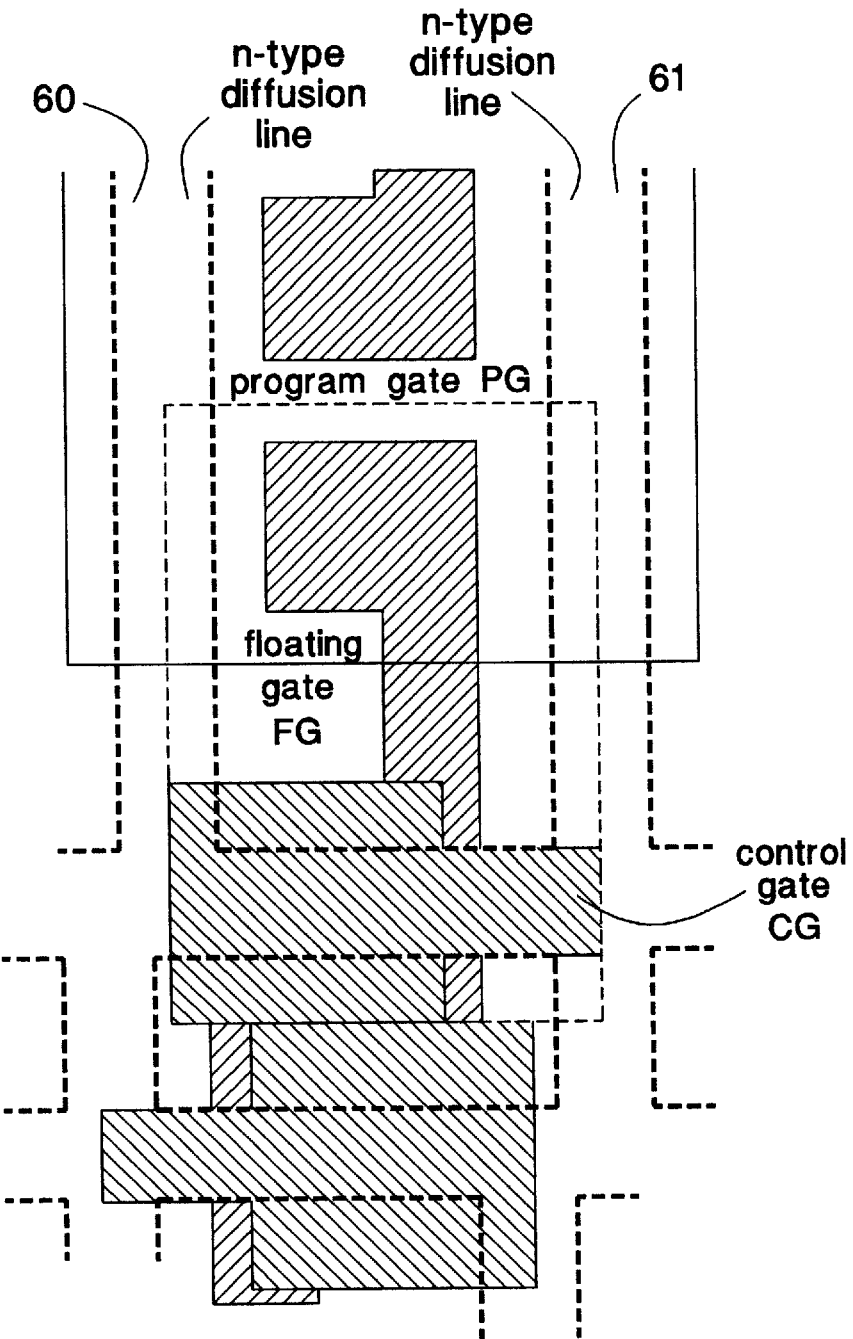
Figure 8:
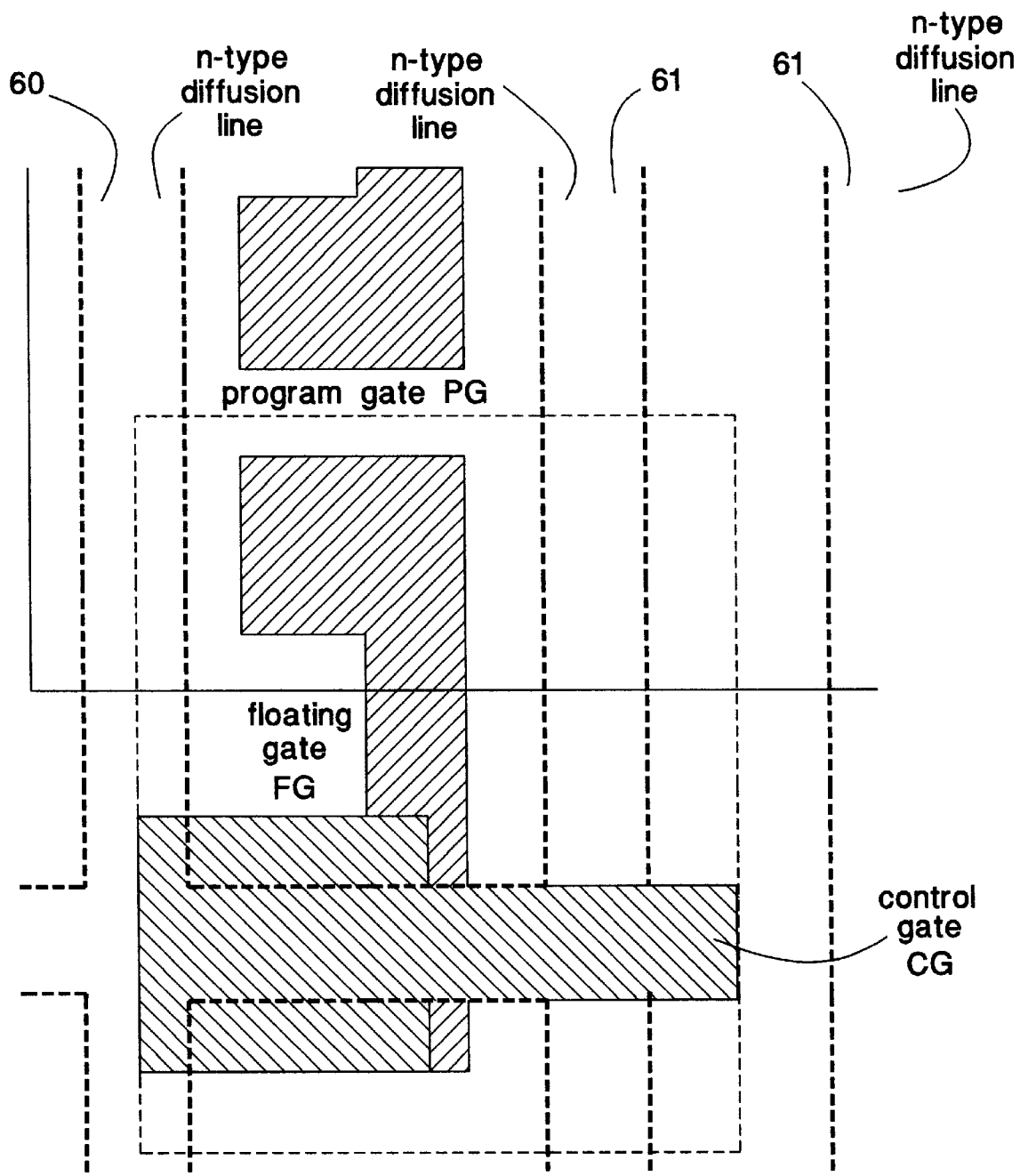
Figure 15:
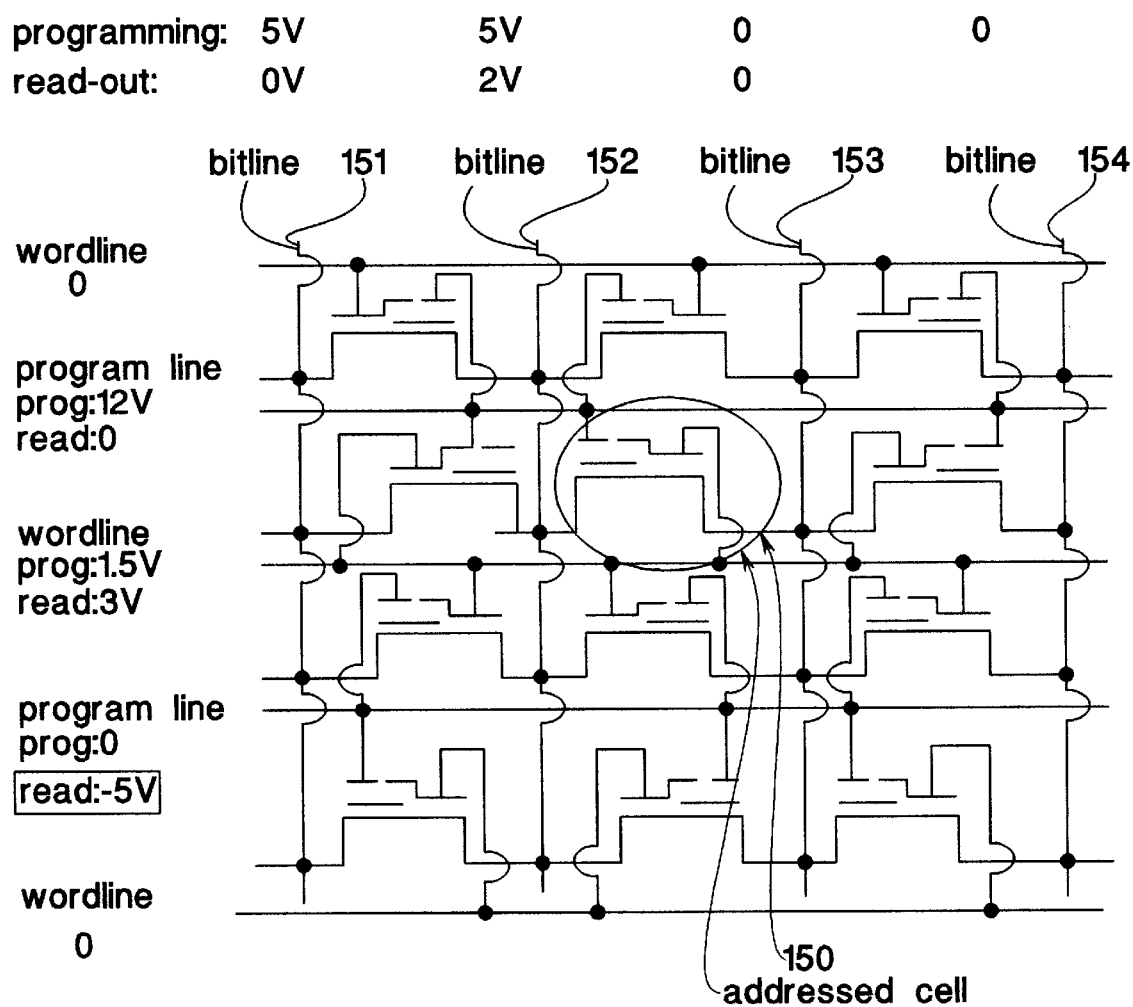
FIG. 15 shows a virtual ground array with shared program lines and shared wordlines. The voltages that have to be applied in order to program/read-out the central (addressed) cell 150, are also presented. Four bitlines 151, 152, 153, and 154 are shown. Note the presence of a negative deselect voltage at the lower program line. The cell boundaries for a contactless array with shared program lines and shared wordlines are indicated in the basic cell layout of FIG. 7.

In a third embodiment, the wordlines are shared between two adjacent rows in the array in order to further decrease the cell area. This is possible due to the triple gate structure of the transistor; although two rows of cells are now selected through the same wordline, programming selectivity is still maintained since the considered rows do not share the same program line (FIG. 15). In order to obtain programming selectivity on a row of cells, the supply voltage has to be applied to the source junction of the cell that shares its drain junction with the cell being programmed as shown in the figure. The resulting gain in cell area is due to the removal of the spacing rule for the polysilicon wordlines from the cell dimensions as shown in FIG. 7. However, during the read-out operation the program line is grounded and, therefore, read-out selectivity is lost, if the read-out scheme described in the foregoing applications Ser. Nos. 07/827,715 and 08/080,225 is maintained. This problem can be resolved by applying a negative (deselect) voltage to the program line which is coupled to the row that is unintentionally selected (see FIG. 15). Consequently, the cells on this deselected row do not draw any current during the read-out operation. This solution maintains the cell performance from the point of view of programming speed, read-out current and drain disturb immunity, at the expense of additional complexity in the row decoder circuitry. If negative voltages are already used for the erase operation, this overhead can, however, be strongly reduced.

Otherwise, the threshold-voltage window can also be defined between two distinct positive values (e.g. +2V and +6V), and a read-out voltage of 4V is then applied to the program line of the selected row. This more traditional read-out scheme allows the different rows to be addressed separately without the need for negative deselect voltages, however, at the expense of a lower cell performance with respect to programming speed and cycling endurance.

However, if a negative deselect voltage is applied, a novel soft-erase effect might occur in the case of FIG. 15. While reading the indicated cell, a negative voltage of −5V is applied to the program line of the row that shares its wordline with the cell being read. If any cell on this particular program line would be subject to the drain read-out voltage of 2V as well, a soft-erase situation would occur. Indeed, the presence of the deselect voltage together with the drain read-out voltage would further increase the electric field in the tunnel oxide, thereby causing a small amount of charge being transferred across the tunnel oxide during each read-out cycle on the cell above. In order to minimize this charge leakage, the following conditions have to be fulfilled (see FIG. 15):

a. The cells on a particular wordline should have alternating orientations.
  b. The cells that share a common wordline should be arranged in such a way that each pair of these cells connected to the same bitline have the opposite orientation along this wordline.
  c. The cells that share a common program line should be arranged in such a way that each pair of these cells connected to the same bitline have the same orientation along this program line.

For this "disturb-immune" array organization, the deselect voltage is never present simultaneously with the drain read-out voltage. Under these circumstances, more than 10 years soft-erase lifetime can be guaranteed without any problem ever for tunnel oxides of only 8 nm. It is noted here that the configuration of FIG. 15 is compatible with the layout of FIG. 7 which allows to remove the wordline spacing rule from the cell dimensions. On the other hand, it should be mentioned that the array depicted in FIG. 15 is a special case of a virtual ground array since the drain and source junctions of the cells on a particular column are still connected to a common bitline, which is similar (but not identical) to the basic configuration shown in FIG. 11. The resulting minimum cell area is 11 $\mu m^2$ in a 0.7 $\mu m$ technology.

For completeness, it should be mentioned that the wordline-oriented sector erase operation in the case of polyoxide conduction implies that the smallest sector is in this case formed by a pair of wordlines.

2.3 Contactless NOR configuration

Figure 1:
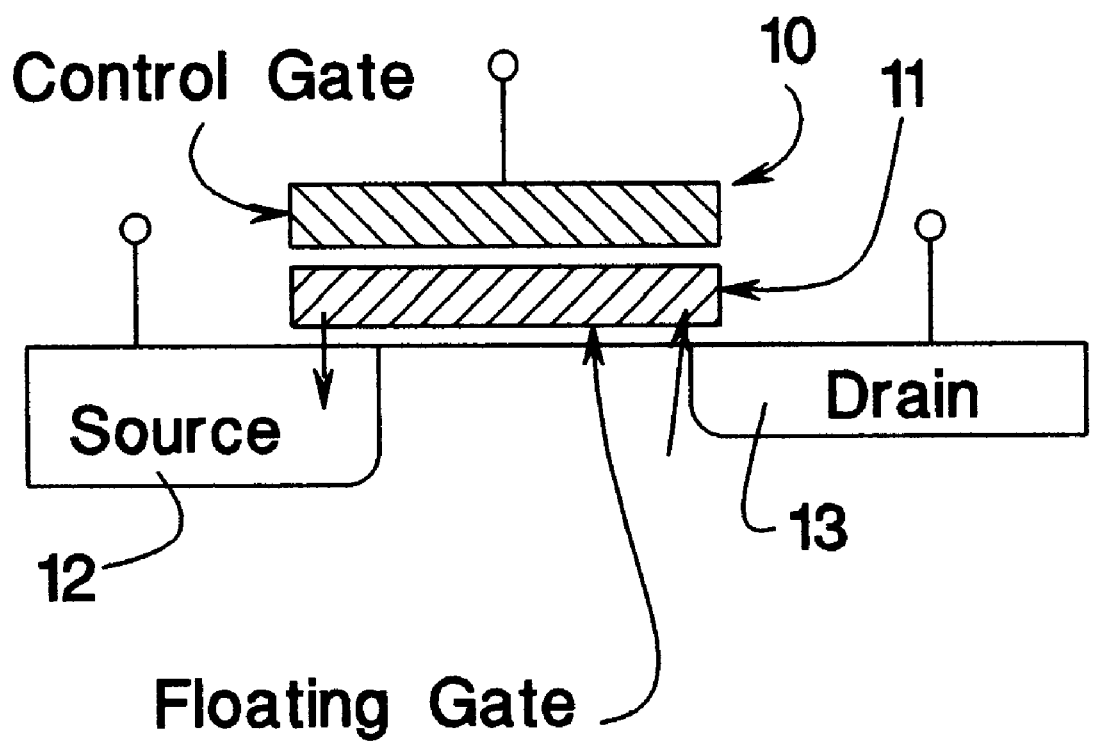
FIG. 1 shows a Flash EEPROM cell which uses conventional channel hot-electron injection for programming (prior art). A control gate 10, floating gate 11, source 12, and drain 13 are shown.
Figure 2:
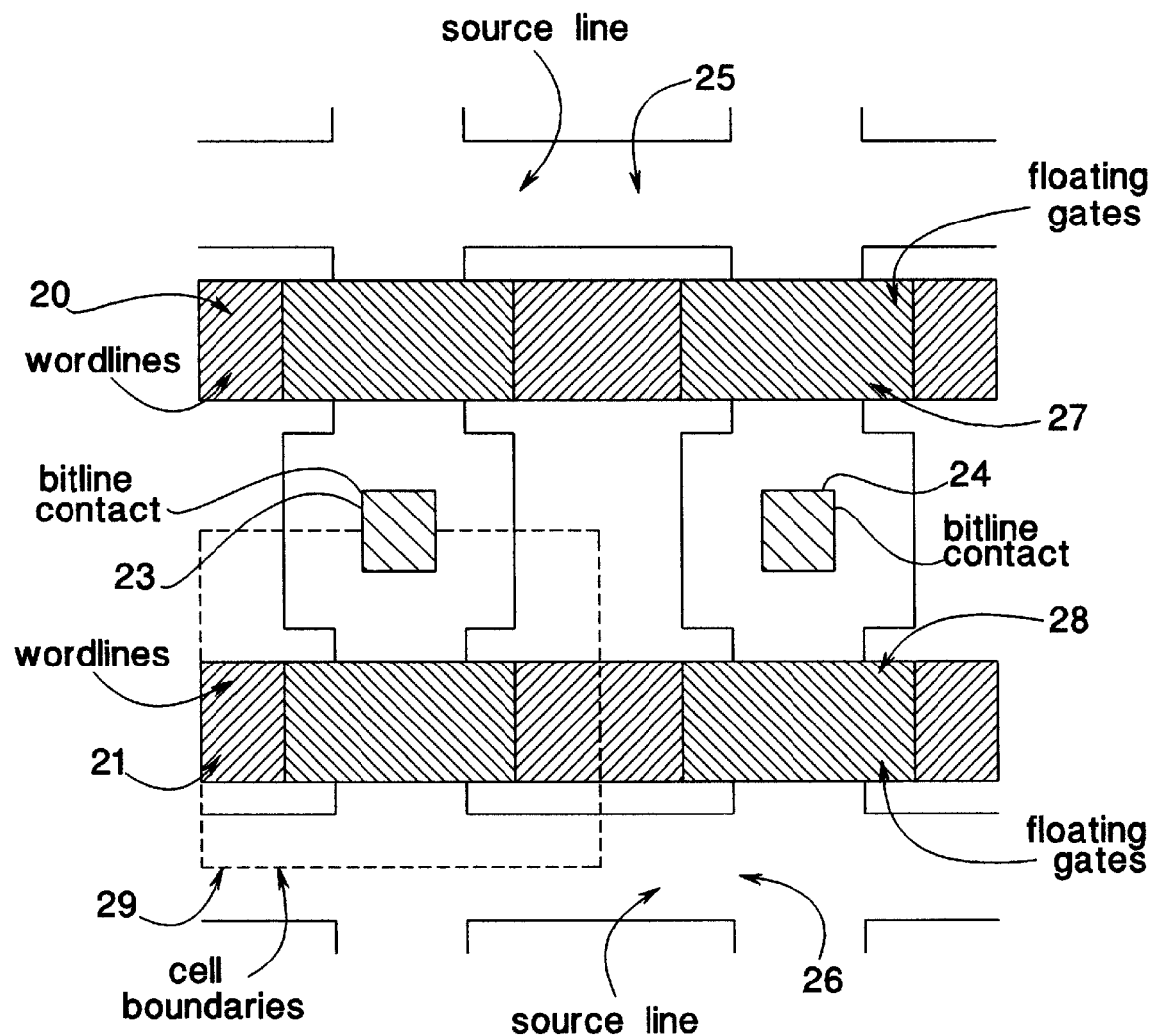
FIG. 2 shows a typical NOR configuration which is used for the cell shown in FIG. 1 (prior art). Wordlines 20, 21, bitline contacts 23, 24, source lines 25, 26, floating gates 27, 28, and cell boundaries 29 are shown.
Figure 3:
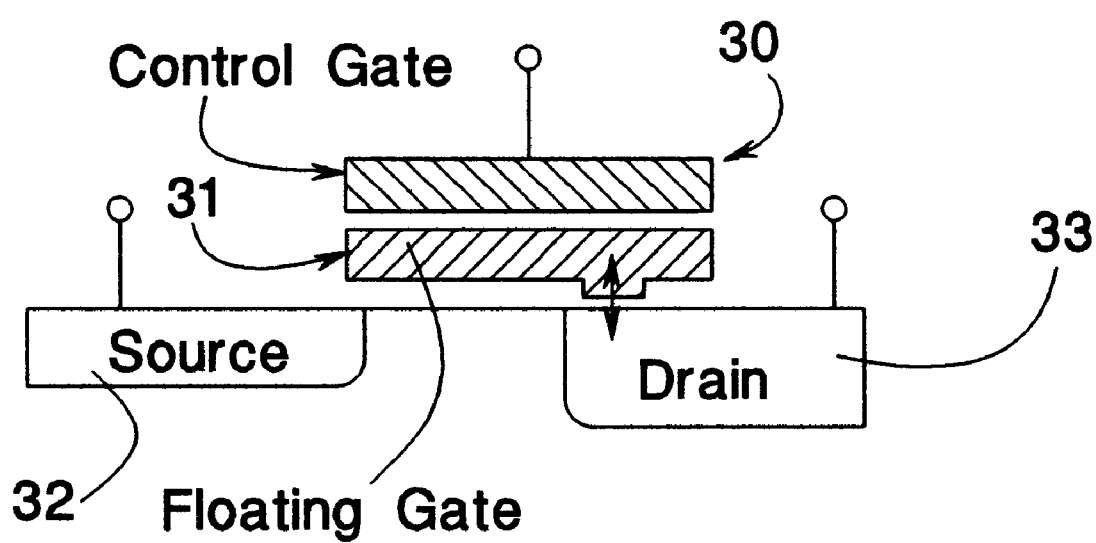
FIG. 3 shows a Flash EEPROM cell which uses bi-directional Fowler-Nordheim tunneling for both programming and erasure (prior art). A control gate 30, floating gate 31, source 32, and drain 33 are shown.
Figure 4:
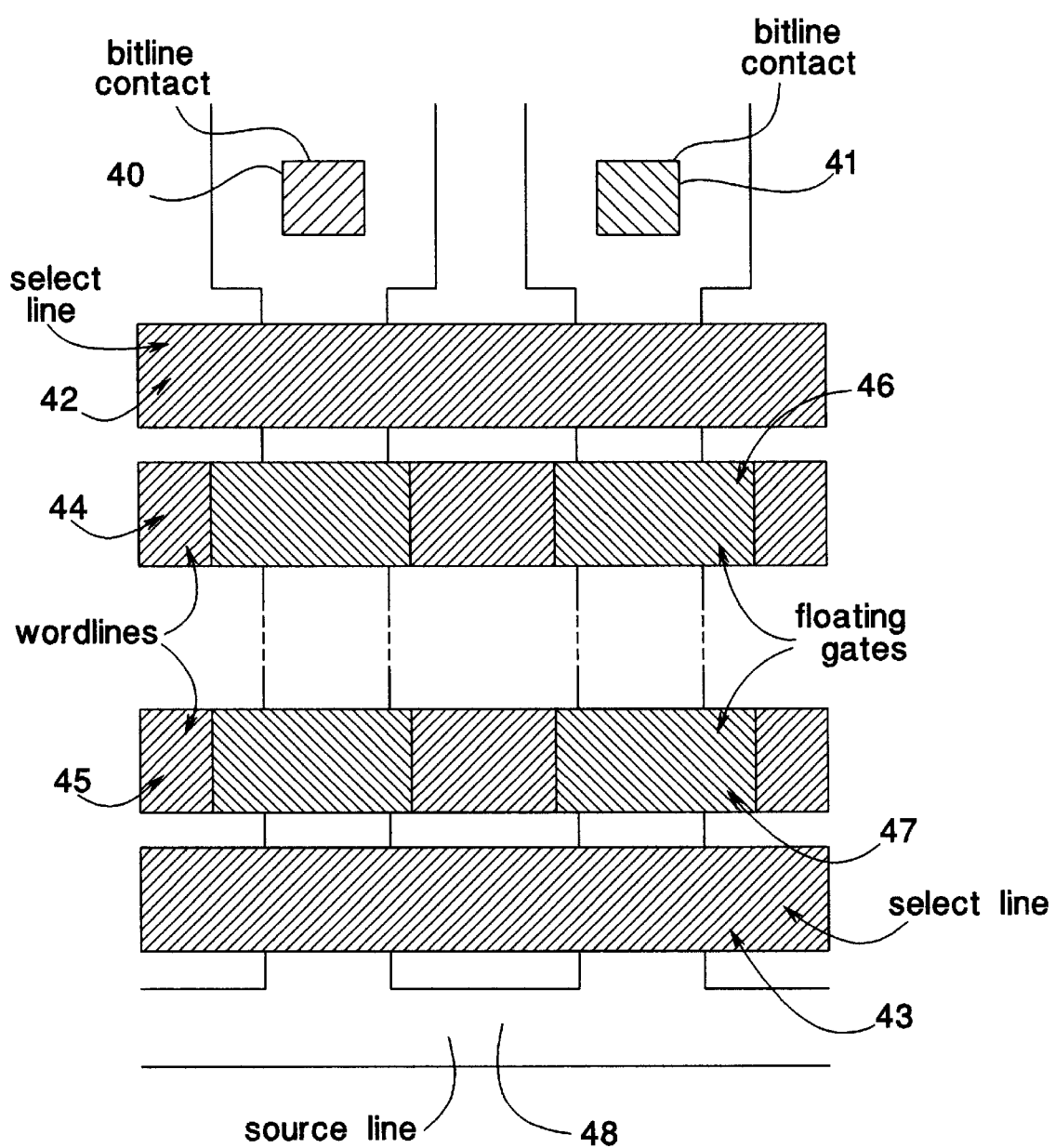
FIG. 4 shows a typical NAND configuration which is used for the cell shown in FIG. 3 (prior art). Bitline contacts 40, 41, select lines 42, 43, wordlines 44, 45, floating gates 46, 47, and source line 48 are shown.
Figure 16:
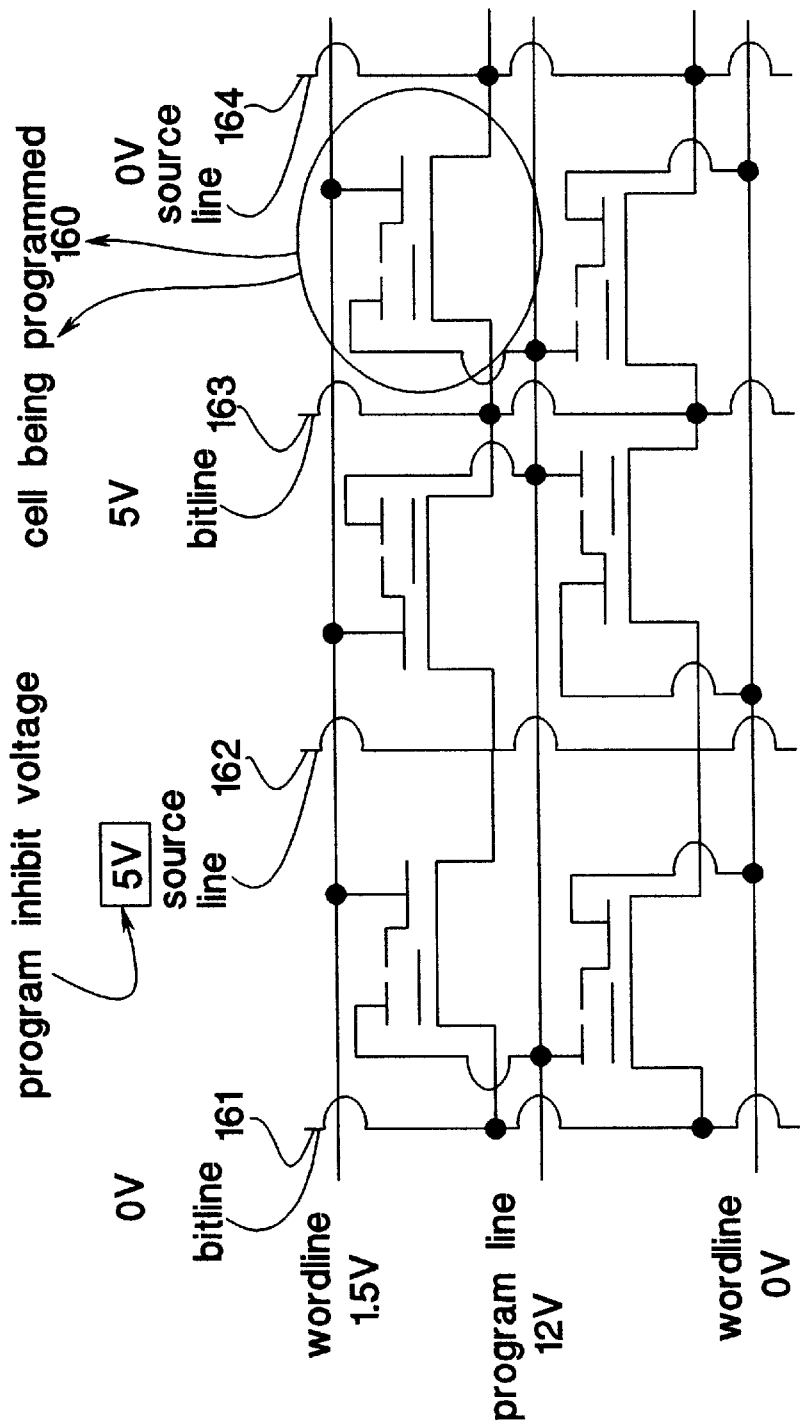
FIG. 16, shows a contactless NOR array with typical voltages to be applied during programming. The cell being programmed 160 and four bitlines 161, 162, 163, and 164 are shown. Dedicated source and bitlines are shared between adjacent columns. Note the program inhibit voltage at the source line of the neighbor column.

Another embodiment of a contactless array for the HIMOS cell is given in FIG. 16. In this case, every diffusion line is either a dedicated bitline or a dedicated source line. This configuration is very similar to the conventional NOR array shown in FIG. 2, but the diffusion lines are now shared between cells in a row in contrast with the conventional NOR scheme where sharing is established between cells in the same column.

A problem with this array is the fact that additional voltages are necessary in order to obtain selectivity during programming. Indeed, the cell that shares the bitline of the cell being programmed on the same row will also be programmed unless the supply voltage is also applied to its source junction (FIG. 16). If this correction is included the problem is resolved since the next cell on the same row is biased in the reverse way, which suppresses the enhanced hot-electron injection mechanism. A consequence of this configuration is, again, that adjacent cells in the same row cannot be programmed or read-out at the same time. The byte organization thus has to be adapted by a proper decoding scheme.

2.4 Contactless common source array

Figure 17:
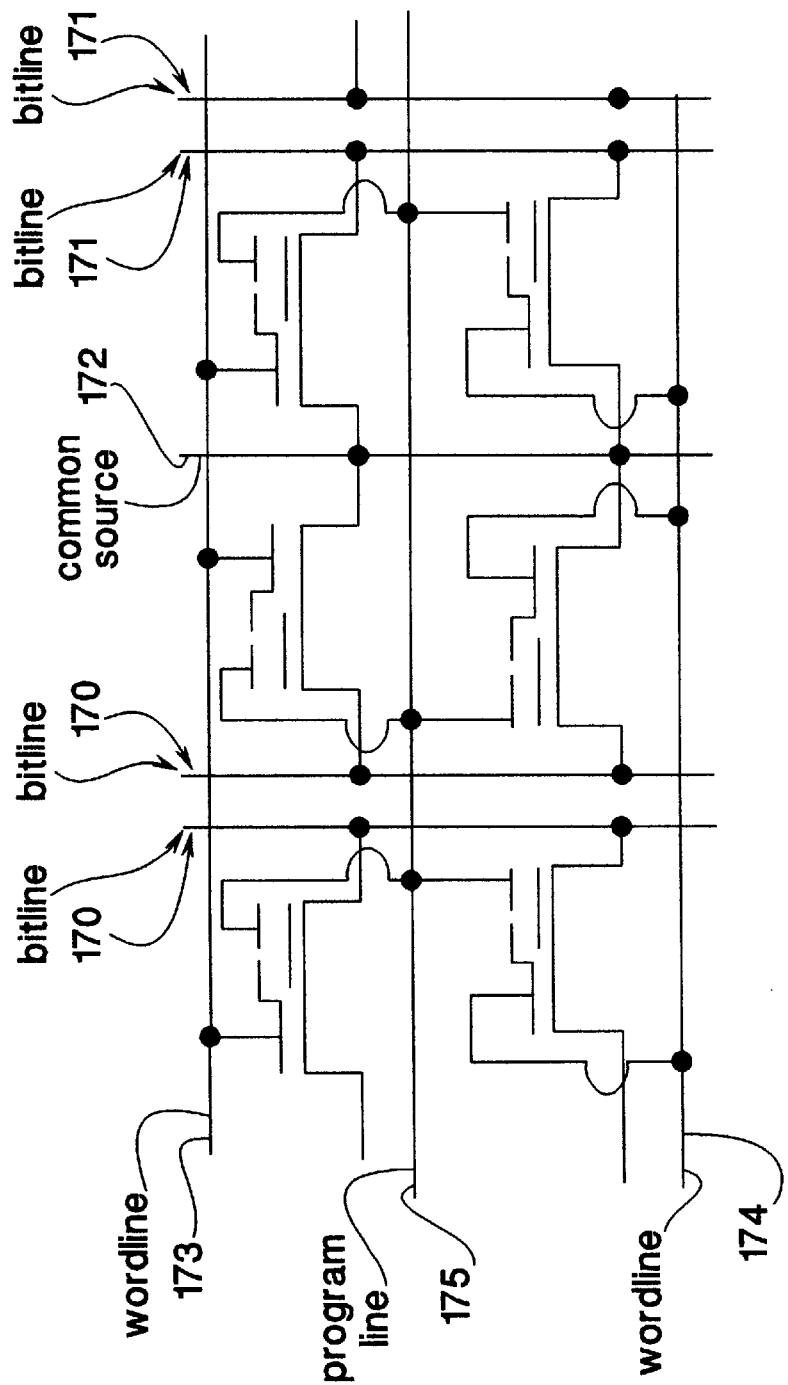
FIG. 17 shows a contactless common source array. Bitlines 170, 171, common source 172, wordlines 173, 174, and program line 175 are shown. In this case, each column has its own separated bitline while the source lines can be shared and physically connected to ground (common source 172). The cell boundaries for a contactless common source array (CCSA) with shared program lines are given in the basic cell layout shown in FIG. 8.

If the bitlines of the respective columns in the array are entirely isolated, a common source array is obtained (FIG. 17). The main advantage of this configuration is the fact that the source lines can be grounded through a substrate (or well) contact, e.g. every 16 or 32 bits. In that case, the source potential always stays very close to the ground potential which ensures a high read-out speed, even in large memory arrays. Another advantage is the straightforward decoder design: the control gate forms the wordline, each column of cells connects to a separate bitline, and source decoding becomes redundant. The main disadvantage is the larger cell area (typically 20–25 $\mu m^2$ in a 0.7 $\mu m$ CMOS technology) which is due to the bitline isolation.

Preferred embodiments of the present invention have been described herein. It is to be understood, however, that changes and modifications can be made without departing from the true scope and spirit of the present invention. The true scope and spirit of the present invention are defined by the following claims, to be interpreted in light of the foregoing specification.

TABLE 1

Typical operating voltages for the HIMOS cell in the write mode, the different erase modes and the read-out mode.

|  | source | drain | control gate | program gate | substrate or p-well |
| --- | --- | --- | --- | --- | --- |
| write | 0 | 3.3/5 | 1/1.5 | 12 | 0 |
| tunnel erase | — | 3.3/5 | 0 | −12 | 0 |
| tunnel erase (alternative) | — | 3.3/5 | −7 | −7 | 0 |
| channel erase | 3.3/5 | 3.3/5 | 0 | −12 | 3.3/5 |
| channel erase (alternative) | 3.3/5 | 3.3/5 | −7 | −7 | 3.3/5 |
| polyoxide erase | — | 0 | 12 | 0 | 0 |
| read-out | 0 | 2 | 3 | $\geq 0$ | 0 |

We claim:

1. A contactless memory array of cells using enhanced hot-electron injection for programming comprising:
   a plurality of cells arranged on a semiconductor substrate, each of said cells having a source region, a drain region, a channel extending between said source and drain regions, a drain voltage applied between said source and drain regions, a floating gate extending over a portion of the channel with a thin oxide layer therebetween, a control gate extending over a portion of said floating gate from above said source region to above said drain region through a dielectric oxide layer, and a program gate extending above said floating gate with a dielectric oxide layer therebetween, a program voltage applied to said program gate, which forms a capacitor with said floating gate with a coupling ratio sufficient to couple a floating gate voltage at least as high as said drain voltage to said floating gate, said floating gate voltage and said drain voltage cooperatively establishing a high voltage at a point in said channel between said control gate and said floating gate and ensuring a high hot-electron injection towards said floating gate;

a common polysilicon wordline interconnecting said control gates of cells on a particular row;

a common polysilicon program line; and a plurality of adjacent wordlines arranged in pairs, where, for each pair, said program gates of the cells on the corresponding wordlines are connected to said common polysilicon program line.

2. A contactless memory array of cells using enhanced hot-electron injection for programming comprising:

a plurality of cells arranged on a semiconductor substrate, each of said cells having a source region, a drain region, a channel extending between said source and drain regions, a floating gate extending over a portion of the channel with a thin oxide layer therebetween, a voltage applied between said source and drain regions, a control gate extending over a portion of said floating gate from above said source region through a dielectric oxide layer, and a program gate extending above said floating gate with a dielectric oxide layer therebetween, a program gate voltage applied to said program gate, which forms a capacitor with said floating gate with a coupling ratio sufficient to couple a floating gate voltage at least as high as said drain voltage to said floating gate, said floating gate voltage and said drain voltage cooperatively establishing a high voltage at a point in said channel between said control gate and said floating gate and ensuring a high hot-electron injection toward said floating gate;

a common polysilicon wordline interconnecting said control gates of cells on a particular row;

a common polysilicon program line; and a plurality of adjacent wordlines arranged in pairs, where, for each pair, said program gates of the cells on the corresponding wordlines are connected to said common polysilicon program line, any two adjacent rows of cells not connected to the same program line being connected to the same wordline.

3. A contactless memory array as claimed in claim 2 further comprising voltage means for applying, during a readout operation, a negative deselect voltage to the program line of an unselected row that shares one of said wordlines with a cell being read.

4. A contactless memory array as claimed in claim 2 further comprising voltage means for applying a positive read-out voltage, during a read out operation, to the program line of a cell being read.

5. A contactless memory array as claimed in claim 1 further comprising;

a plurality of vertical n-type diffusion lines under said polysilicon wordlines and program lines; and a vertical metal line connected to at least one of said diffusion lines by a contact every n cells, where n can be any power of 2; and wherein said source and drain regions of said cells are connected to said vertical n-type diffusion lines and said regions are strapped by said vertical metal line; and said program lines are isolated from said floating gates of said cells.

6. A contactless memory array as claimed in claim 5 wherein each cell defines an orientation, said cells define columns as well as rows, and said wordline defines a direction;

said orientation of said cells is identical in said direction of said wordline; and said vertical diffusion lines are common for any two adjacent columns of cells, whereby a virtual ground array is established.

7. A contactless memory array as claimed in claim 2 further comprising;

a plurality of vertical n-type diffusion lines under said polysilicon wordlines and program lines; and a vertical metal line connected to at least one of said diffusion lines by a contact every n cells, where n can be any power of 2; and wherein said source and drain regions of said cells are connected to said vertical n-type diffusion lines and said regions are strapped by said vertical metal line; and said program lines are isolated from said floating gates of said cells.

8. A contactless memory array as claimed in claim 5 wherein each cell defines an orientation and said wordline defines a direction;

the cells on a particular row have alternating orientations in said direction of said wordline;

said cell orientation in said direction of said wordline is identical for cells connected to the same diffusion line whereby a contactless NOR configuration is established; and voltage means for applying a supply voltage to said diffusion line, during programming, that is connected to said source region of the cell having its drain region connected to the same diffusion line as a cell being programmed.

9. A contactless memory array as claimed in claim 7 wherein each cell defines an orientation, said cells define columns as well as rows, and said wordline defines a direction;

said orientation of said cells is identical in said direction of said wordline; and said vertical diffusion lines are common for any two adjacent columns of cells, whereby a virtual ground array is established.

10. A contactless memory array of cells comprising:

a plurality of cells wherein each cell defines an orientation and includes a semiconductor substrate including a source region, a drain region, a channel extending in a first direction between said source and drain regions, a floating gate extending over a portion of the channel and ending over said channel, said floating gate integrally including first and second floating gate portions, said first floating gate portion extending near said channel with a thin oxide layer therebetween, and said second floating gate portion extending away from said channel, a program gate capacitively coupled through a dielectric oxide layer to said second floating gate portion, and a control gate laterally remote in a second direction from said program gate and extending through a dielectric oxide layer over said first floating gate portion from above said source region said first direction being substantially perpendicular to said second direction;

said cells defining columns as well as rows;

a plurality of common polysilicon wordlines, where each of said wordlines interconnects said control gates of said cells on a particular row, and where said wordlines define a direction;

said cells on a particular row having alternating orientations in said direction of said wordline;

each column of cells having a separate diffusion line connected to the drain regions of the cells of said column; and each two columns of cells having the same diffusion line connected to the source regions of the cells of said two columns, which establishes a contactless common source array.

11. A contactless memory array as claimed in claim 7 wherein each cell defines an orientation;

said cells define columns as well as rows;

said wordline defines a direction;

the cells on a particular row have alternating orientations in said direction of said wordline;

said cells are arranged in pairs of adjacent rows, wherein the cell orientation in the direction of said wordline is identical for cells connected to the same diffusion line;

said cell orientation is reversed every pair of rows for cells connected to the same diffusion line;

said vertical diffusion lines are common for any two adjacent columns of cells, whereby a virtual ground array is established; and voltage means for applying a supply voltage to said diffusion line, during programming, that is connected to said source region of the cell having its drain region connected to the same diffusion line as the cell being programmed.

12. A contactless memory array of cells using enhanced hot-electron injection for programming, comprising, in combination:

a plurality of cells arranged on a semiconductor substrate, each of said cells having a source region, a drain region, a channel extending between said source and drain regions, a drain voltage between said source and drain regions, a floating gate extending over a portion of the channel with a thin oxide layer therebetween, a control gate extending over a portion of said floating gate from above said source region through a dielectric oxide layer, and a program gate extending above said floating gate with a coupling ratio sufficient to couple a voltage at least as high as said drain voltage to said floating gate, thereby establishing a high voltage at a point in said channel between said control gate and said floating gate and ensuring a high hot-electron injection towards said floating gate;

a common polysilicon wordline interconnecting said control gates of said cells on a particular row;

a common polysilicon program line;

a plurality of adjacent wordlines arranged in pairs, where, for each pair, said program gates of the cells on the corresponding wordlines are connected to said common polysilicon program line;

a plurality of vertical n-type diffusion lines under said polysilicon wordlines and program lines;

a vertical metal line connected to at least one of said diffusion lines by a contact every n cells, where n can be a power of 2;

said source and drain regions of said cells are connected to said vertical n-type diffusion lines and said regions are strapped by said vertical metal line;

said program lines are isolated from said floating gates of said cells;

each cell defines an orientation, said cells define columns as well as rows, and said wordline defines a direction;

said orientation of said cells is identical in said direction of said wordline; and said vertical diffusion lines are common for any two adjacent columns of cells.

13. A contactless memory array of cells using enhanced hot-electron injection for programming comprising:

a plurality of cells arranged on a semiconductor substrate, each of said cells having a source region, a drain region, a channel extending between said source and drain regions, a drain voltage between sad source and drain regions, a floating gate extending over a portion of the channel with a thin oxide layer therebetween, a control gate extending over a portion of said floating gate from above said source region through a dielectric oxide layer, and a program gate extending above said floating gate with a coupling ratio sufficient to couple a voltage at least as high as said drain voltage to said floating gate, hereby establishing a high voltage at a point in said channel between said control gate and said floating gate and ensuring a high hot-electron injection towards said floating gate;

a common polysilicon wordline interconnecting said control gates of cells on a particular row;

a common polysilicon program line;

a plurality of adjacent wordlines arranged in pairs, where, for each pair, said program gates of the cells on the corresponding wordlines are connected to said common polysilicon program line;

a plurality of vertical n-type diffusion lines under said polysilicon wordlines and program lines;

a vertical metal line connected to at least one of said diffusion lines by a contact every n cells, where n can be any power of 2;

wherein said source and drain regions of said cells are connected to said vertical n-type diffusion lines and said regions are strapped by said vertical metal line;

said program lines are isolated from said floating gates of said cells;

each cell defines an orientation and said wordline defines a direction;

the cells on a particular row have alternating orientations in said direction of said wordline;

said cell orientation in said direction of said wordline is identical for cells connected to the same diffusion line; and voltage means for applying a supply voltage to said diffusion line, during programming, that is connected to said source region of the cell having its drain region connected to the same diffusion line as a cell being programmed.

14. A contactless memory array of cells using enhanced hot-electron injeciton for programming comprising:

a plurality of cells arranged on a semiconductor substrate, each of said cells having a source region, a drain region, a channel extending between said source and drain regions, a drain voltage applied between said source and drain regions, a floating gate extending over a portion of the channel with a thin oxide layer therebetween, a control gate extending over a portion of said floating gate from above said source region through a dielectric oxide layer, and a program gate extending above said floating gate with a dielectric oxide layer therebetween, a program voltage applied to said program gate, which forms a capacitor with said floating gate with a coupling ratio sufficient to couple a floating gate voltage of at least as high as said drain voltage to said floating gate, said floating gate voltage and said drain voltage cooperatively establishing a high voltage at a point in said channel between said control gate and said floating gate and ensuring a high hot-electron injection towards said floating gate;

a common polysilicon wordline interconnecting said control gates of cells on a particular row and extending in a first direction;

a common polysilicon program line isolated from said floating gates of said cells;

a plurality of adjacent wordlines arranged in pairs, where, for each pair, said program gates of the cells on the corresponding wordlines are connected to said common polysilicon program line; and each of said cells defining an orientation identical in said direction of said common polysilicon wordline.

* * * * *